United States Patent
Tunks et al.

(10) Patent No.: US 11,687,130 B1
(45) Date of Patent: Jun. 27, 2023

(54) HEATER APPARATUS-INTEGRATED PERIPHERAL COMPONENT INTERCONNECT CARD FOR A COMPUTING DEVICE

(71) Applicant: Dell Products L.P., Round Rock, TX (US)

(72) Inventors: Eric Michael Tunks, Austin, TX (US); John Randolph Stuewe, Round Rock, TX (US); Ayedin Nikazm, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 56 days.

(21) Appl. No.: 17/576,658

(22) Filed: Jan. 14, 2022

(51) Int. Cl.
*H05K 7/14* (2006.01)
*G06F 1/18* (2006.01)
*H05K 1/02* (2006.01)
*G05D 23/19* (2006.01)
*G05B 15/02* (2006.01)

(52) U.S. Cl.
CPC ........... *H05K 1/0212* (2013.01); *G05B 15/02* (2013.01); *G05D 23/1927* (2013.01); *G06F 1/185* (2013.01); *H05K 7/1487* (2013.01); *H05B 2203/013* (2013.01); *H05B 2203/016* (2013.01)

(58) Field of Classification Search
CPC . G06F 1/181; G06F 1/182; G06F 1/20; G06F 1/206; H05K 7/1495
See application file for complete search history.

(56) References Cited

U.S. PATENT DOCUMENTS

| | | | | |
|---|---|---|---|---|
| 5,142,444 A | * | 8/1992 | Matta | H01L 23/49572 361/813 |
| 5,930,115 A | * | 7/1999 | Tracy | H05K 7/20727 361/689 |
| 6,937,474 B2 | * | 8/2005 | Lee | F28D 15/0275 361/679.52 |
| 7,019,974 B2 | * | 3/2006 | Lee | G06F 1/20 174/15.2 |
| 7,436,667 B2 | * | 10/2008 | Wu | G06F 1/20 257/E23.099 |
| 7,515,423 B2 | * | 4/2009 | Peng | H05K 7/20936 307/146 |
| 7,885,063 B2 | * | 2/2011 | Yu | H01L 23/427 165/185 |
| 7,933,125 B2 | * | 4/2011 | Wei | H05K 7/20772 361/708 |
| 8,004,841 B2 | * | 8/2011 | Cipolla | F28D 15/0233 174/15.1 |
| 8,018,721 B2 | * | 9/2011 | Chang | H01L 23/473 361/679.52 |
| 8,208,251 B2 | * | 6/2012 | Tan | H01L 23/427 361/689 |

(Continued)

OTHER PUBLICATIONS

EPEC Engineered Technologies, Polyimide/Kapton Flexible Heaters, https://www.epectec.com/flexible-heaters/polyimide-kapton-heaters.html, Jun. 2019 (wayback machine dated).*

*Primary Examiner* — Adrian S Wilson
(74) *Attorney, Agent, or Firm* — Chamberlain, Hrdlicka, White, Williams & Aughtry

(57) ABSTRACT

A computing device includes a peripheral component interconnect (PCI) card and a heater apparatus. The heater apparatus is located proximate to the PCI card and configured to heat the PCI card.

20 Claims, 5 Drawing Sheets

(56) References Cited

U.S. PATENT DOCUMENTS

| | | | | |
|---|---|---|---|---|
| 8,570,744 B2* | 10/2013 | Rau | ................ | H01L 23/473 |
| | | | | 361/720 |
| 8,767,403 B2* | 7/2014 | Rau | ................ | G06F 1/20 |
| | | | | 361/721 |
| 9,292,055 B2* | 3/2016 | Wu | ................ | G06F 1/185 |
| 9,470,567 B2* | 10/2016 | Moore | ................ | G01F 1/69 |
| 9,798,902 B2* | 10/2017 | Ludlow | ................ | G06F 21/86 |
| 10,485,113 B2* | 11/2019 | Dunn | ................ | G02F 1/133382 |
| 10,516,474 B1* | 12/2019 | Woodman | ................ | H04B 7/18506 |
| 10,624,226 B1* | 4/2020 | Alvarado | ................ | H05K 7/1408 |
| 10,705,578 B2* | 7/2020 | Franz | ................ | H10B 12/01 |
| 10,734,756 B2* | 8/2020 | Shaw | ................ | H01R 12/737 |
| 10,869,381 B2* | 12/2020 | Zhai | ................ | H05K 7/20545 |
| 10,998,671 B2* | 5/2021 | Shaw | ................ | H01R 43/205 |
| 11,144,100 B2* | 10/2021 | Chang | ................ | G06F 1/185 |
| 11,166,366 B2* | 11/2021 | Zirretta | ................ | H05K 1/0271 |
| 11,570,885 B2* | 1/2023 | Zirretta | ................ | G06F 1/185 |
| 11,617,284 B2* | 3/2023 | Qu | ................ | H05K 1/0203 |
| | | | | 257/720 |
| 2005/0061477 A1* | 3/2005 | Mira | ................ | H01L 23/467 |
| | | | | 257/E23.099 |
| 2006/0109636 A1* | 5/2006 | Hood, III | ................ | G06F 1/185 |
| | | | | 361/792 |
| 2011/0286179 A1* | 11/2011 | Motschman | ................ | H01L 23/4093 |
| | | | | 361/679.54 |
| 2012/0033370 A1* | 2/2012 | Reinke | ................ | G06F 13/4068 |
| | | | | 361/748 |
| 2013/0107454 A1* | 5/2013 | Wilke | ................ | H05K 7/20727 |
| | | | | 361/694 |
| 2013/0138935 A1* | 5/2013 | Belady | ................ | G06F 9/44 |
| | | | | 713/1 |
| 2015/0003004 A1* | 1/2015 | Wu | ................ | G06F 1/188 |
| | | | | 361/679.32 |
| 2015/0177779 A1* | 6/2015 | Clayton | ................ | H01R 12/62 |
| | | | | 361/749 |
| 2016/0033212 A1* | 2/2016 | Wang | ................ | F28F 13/187 |
| | | | | 165/104.21 |

* cited by examiner

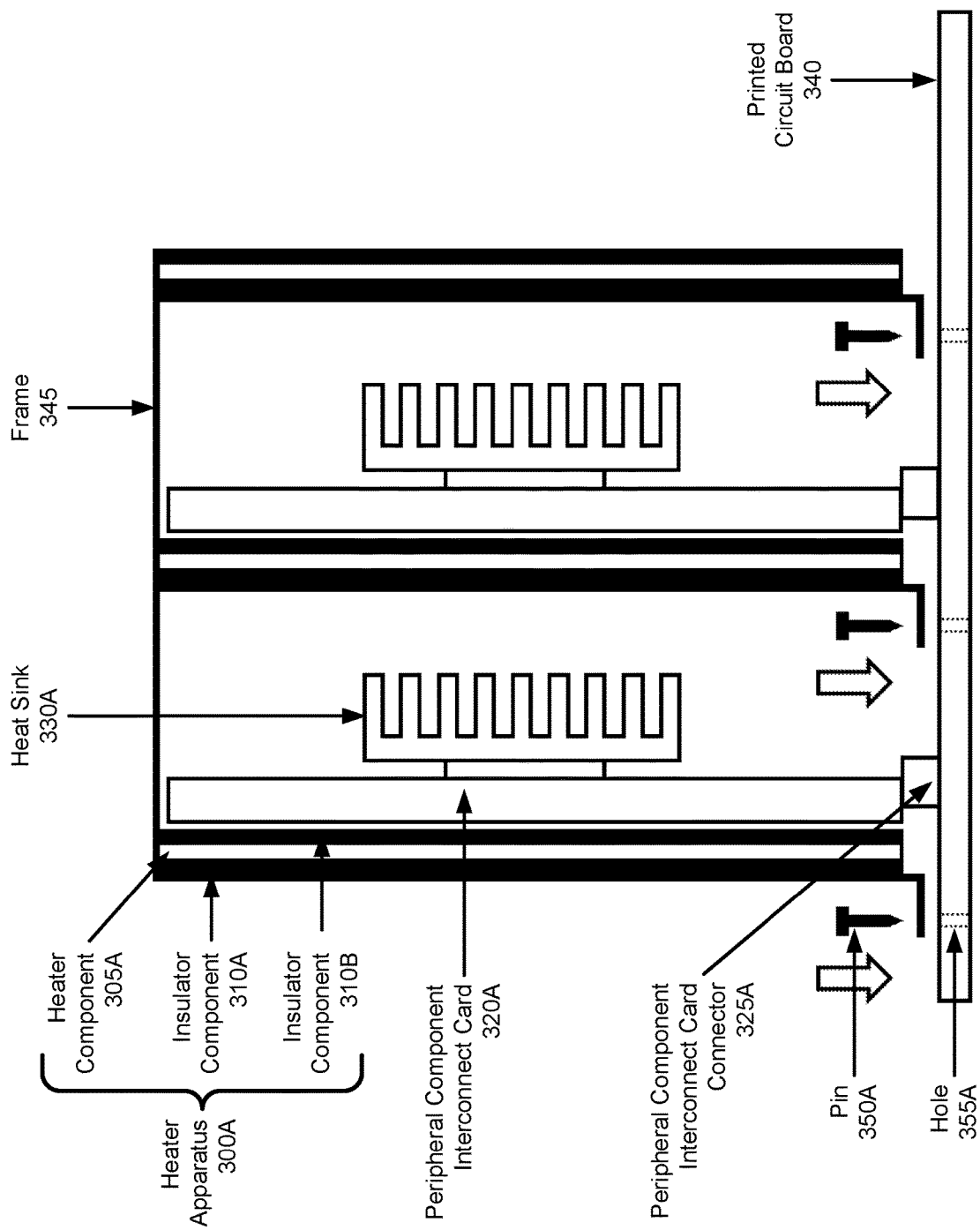
FIG. 3.1

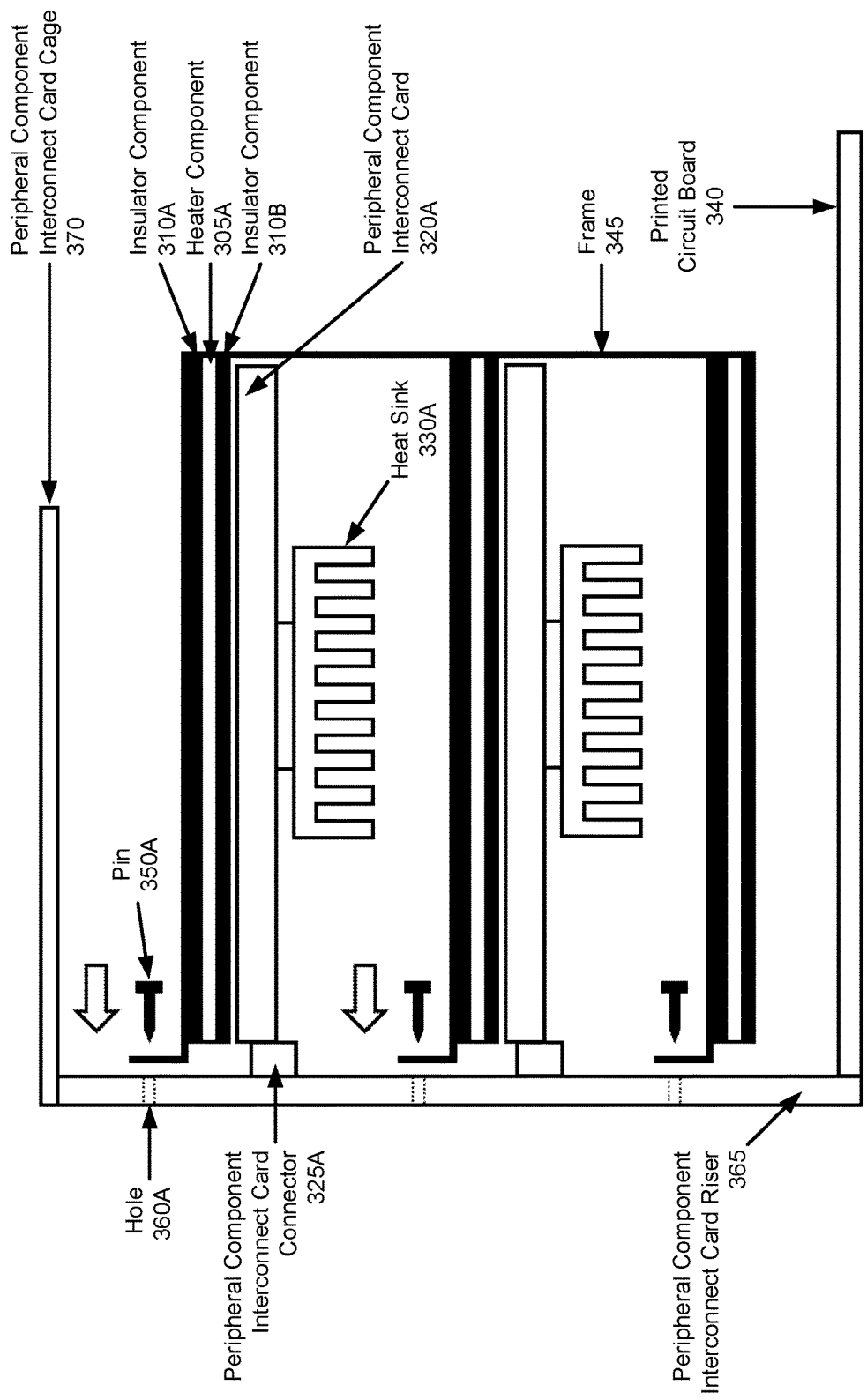
FIG. 3.2

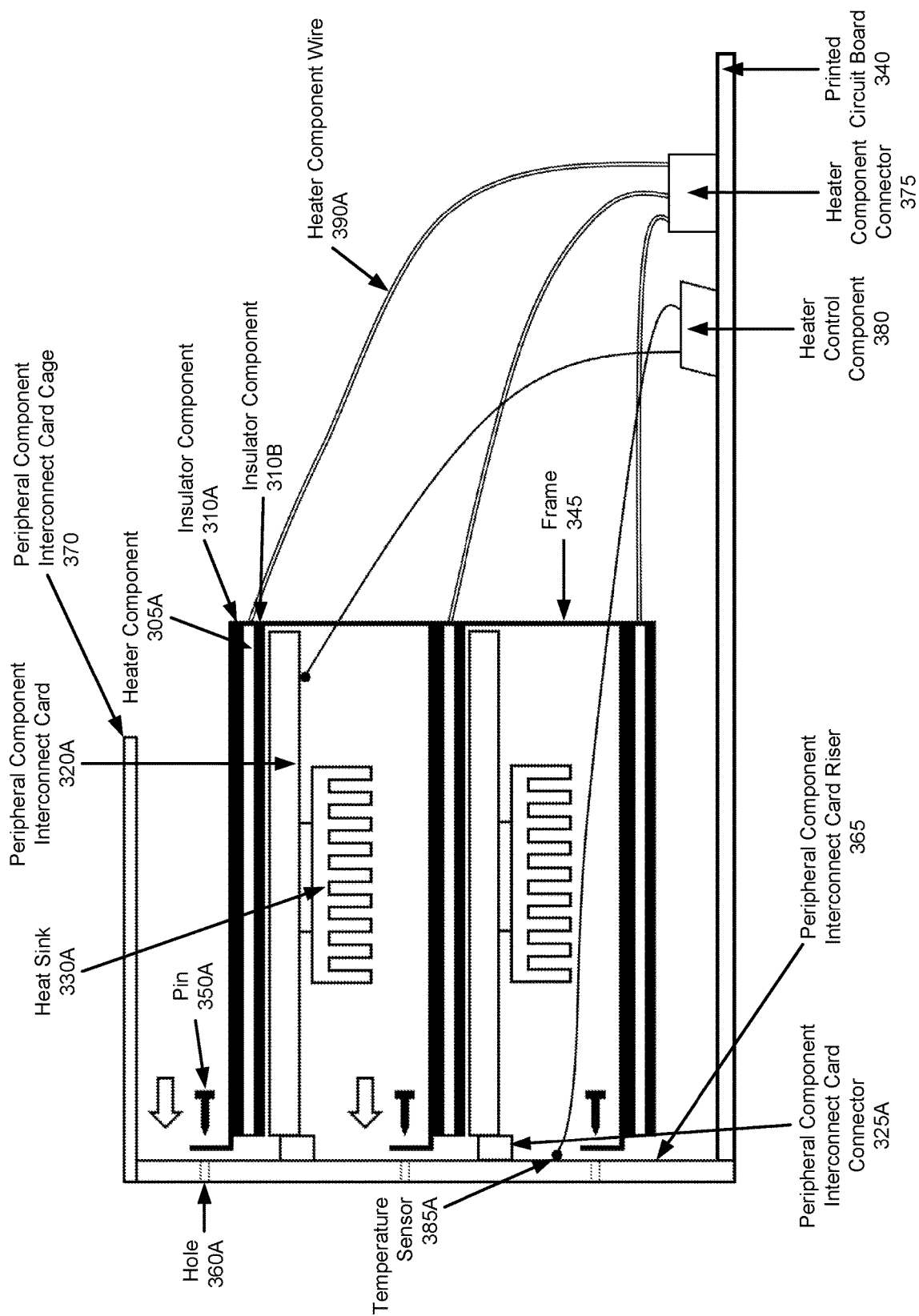
FIG. 3.3

HEATER APPARATUS-INTEGRATED PERIPHERAL COMPONENT INTERCONNECT CARD FOR A COMPUTING DEVICE

BACKGROUND

Computing devices may perform services. In order to provide the services, the computing devices may include hardware components and software components. The software components may utilize the hardware components to provide the services.

SUMMARY

In general, in one aspect, the invention relates to a computing device. The computing device includes a peripheral component interconnect (PCI) card and a heater apparatus. The heater apparatus is located proximate to the PCI card and configured to heat the PCI card.

In general, in one aspect, the invention relates to an information handling system including a cabinet housing a plurality of computing devices. Each computing device includes a peripheral component interconnect (PCI) card and a heater apparatus. The heater apparatus is located proximate to the PCI card and configured to heat the PCI card.

In general, in one aspect, the invention relates to a method for heating a peripheral component interconnect (PCI) card in a computing device. The method for heating the PCI card in the computing device may include determining a heating condition of the computing device; in response to determination, initiating heating of the PCI card using a heater component that is parallel to the PCI card, wherein the heater component is proximate to a first side of the PCI card.

BRIEF DESCRIPTION OF DRAWINGS

Certain embodiments of the invention will be described with reference to the accompanying drawings. However, the accompanying drawings illustrate only certain aspects or implementations of the invention by way of example, and are not meant to limit the scope of the claims.

FIG. 3.1 shows a side-view of a portion of a computing device in accordance with one or more embodiments of the invention.

FIG. 3.2 shows a side-view of a portion of a computing device in accordance with one or more embodiments of the invention.

FIG. 3.3 shows a side-view of a portion of a computing device in accordance with one or more embodiments of the invention.

DETAILED DESCRIPTION

Figure 1:
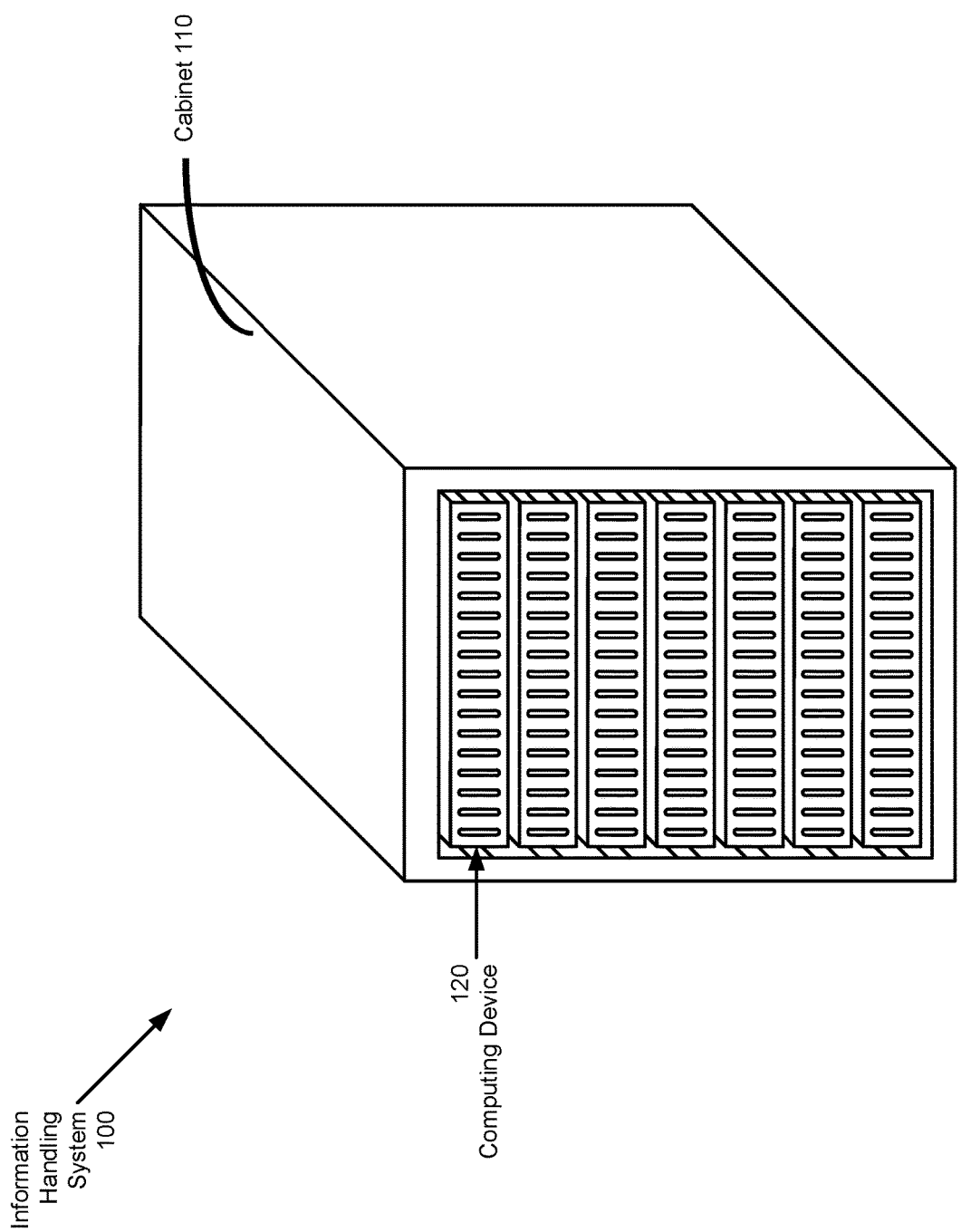
FIG. 1 shows a diagram of an information handling system in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details, and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct (e.g., wired directly between two devices or components) or indirect (e.g., wired and/or wireless connections between any number of devices or components connecting the operatively connected devices) connection. Thus, any path through which information and/or power may travel may be considered an operative connection.

Computing devices may include any number of hardware components that facilitate providing the services of the computing devices. The hardware components may include, for example, processors, non-persistent storage drives, persistent storage drives, circuit cards that interconnect these components, etc. In some cases, computing devices might be deployed in environments that result in the temperature of the computing devices being outside of their designed operating range. For example, the computing devices may be designed to operate at temperatures above 0° C. When the computing devices are deployed to harsh environmental conditions (e.g., −40° C.-60° C.), the computing devices may not operate properly and, in certain scenarios, may be damaged.

To address one or more of the aforementioned issues, embodiments of the invention provide a heating mechanism to heat a peripheral component interconnect (PCI) card(s) in a computing device to a temperature that is within its designed operating range. More specifically, embodiments of the invention include a heater apparatus that is located proximate to the PCI card. The positioning of the heater apparatus enables targeted heating of the PCI card without taking up valuable space within the computing device.

Various embodiments of the computing device are described below.

FIG. 1 shows a diagram of an information handling system (100) in accordance with one or more embodiments of the invention. The system may include a cabinet (110) and any number of computing devices (e.g., 120).

The cabinet (110) may be a mechanical structure that enables computing devices (e.g., 120) to be positioned with respect to one another. For example, the cabinet (110) may be a rack mountable enclosure that enables the computing devices (e.g., 120) to be disposed within it. The cabinet (110) may be implemented as other types of structures adapted to house, position, orient, and/or otherwise physically, mechanically, electrically, and/or thermally manage the computing devices (e.g., 120). By managing the computing devices (e.g., 120), the cabinet (110) may enable multiple computing devices to be densely packed in a space without negatively impacting the operation of the information handling system (100).

A computing device (e.g., 120) may be a mechanical structure for housing components of the information handling system (100). For example, the computing device (e.g., 120) may be implemented as a rack mountable enclosure for housing components of the information handling system. The computing device (e.g., 120) may be adapted to be disposed within the cabinet (110) and/or utilize services provided by the cabinet (110) and/or other devices.

To provide services, the computing device (e.g., 120) may utilize computing device resources provided by hardware components. The hardware components may include, for example, processors, non-persistent storage drives, a printed circuited board(s), persistent storage drives, special purpose hardware, and/or other types of physical components that contribute to the operation of the computing device.

Figure 2:
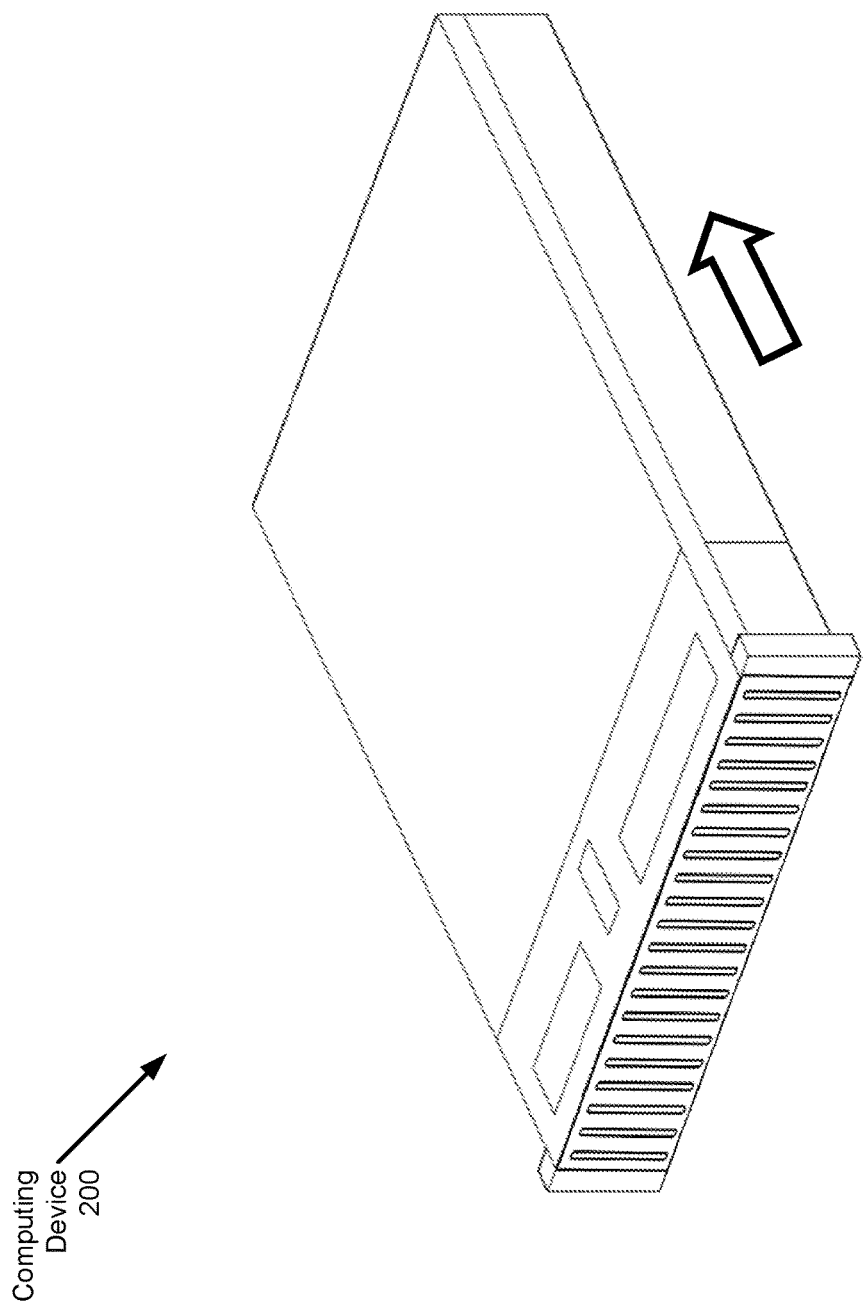
FIG. 2 shows a diagram of a computing device in accordance with one or more embodiments of the invention.

Turning now to FIG. 2, FIG. 2 shows a diagram of a computing device (200) in accordance with one or more embodiments of the invention. In one or more embodiments of the invention, the computing device includes six sides (i.e., top, bottom, right, left, front, and back), where air drawn into from the frontside of the computing device and expelled from the backside of the computing device (airflow direction is shown with an arrow). In general, air incoming from the frontside of the computing device is cooler than air outgoing from the backside of the computing device.

In one or more embodiments of the invention, to provide services, the computing device (200) may utilize computing device resources provided by a number of hardware components housed within the computing device. The number of hardware components may include, for example, persistent storage drives (not shown), non-persistent storage drives (not shown), processors (not shown), peripheral component interconnects (not shown), a printed circuit board (not shown), and/or other types of physical components that contribute to the operation of the computing device (200). Some examples of the hardware components are shown in FIGS. 3.1-3.3, but the examples of the hardware components are not limited to those shown in FIGS. 3.1-3.3. In other embodiments, one or more of the hardware components may be omitted or additional hardware components may be added based on the services provided by the computing device.

FIGS. 3.1 and 3.2 show different embodiments to employ a heater apparatus-integrated PCI card in a computing device in accordance with one or more embodiments disclosed below.

Turning now to FIG. 3.1, FIG. 3.1 shows a side-view of a portion of a computing device in accordance with one or more embodiments of the invention. In one or more embodiments of the invention, the side-view of the portion of the computing device includes a heater apparatus (e.g., 300A) in which the heater apparatus includes a heater component (e.g., 305A) and a number of insulator components (e.g., 310A, 310B), a PCI card (e.g., 320A), a PCI card connector (e.g., 325A), a heat sink (e.g., 330A), a printed circuit board (340), a frame (345), a number of pins (e.g., 350A), and a number of holes (e.g., 355A).

In an embodiment of the invention shown in FIG. 3.1, the PCI card (e.g., 320A) is oriented orthogonally to the printed circuit board (340) and is connected to the printed circuit board via the PCI card connector (e.g., 325A). The heater component (e.g., 305A) is parallel to the PCI card, in which the heater apparatus (e.g., 300A) is located proximate to the PCI card (e.g., 320A) and is configured to heat the PCI card. Further, the base of the heat sink (e.g., 330A) is affixed to the PCI card (e.g., 320A). While the heater component (e.g., 305A) heats the PCI card, any excess thermal energy may leave the PCI card through the heat sink (e.g., 330A). In this manner, the surface area of the PCI card will be enlarged for faster thermal energy dissipation when necessary.

Those skilled in the art will appreciate that while the embodiment of the invention shown in FIG. 3.1 includes the heat sink (e.g., 330A), there may be embodiments of the invention that do not include the heat sink without departing from the invention.

In one or more embodiments of the invention, the heater apparatus (e.g., 300A) is affixed to the frame (345) and the corresponding parts of the frame are affixed to the printed circuit board (340) via the number of pins (e.g., 350A). After applying an inward force (shown with an arrow), the number of pins passes through the number of holes (e.g., 355A) to secure the frame (345) to the printed circuit board (340). While FIG. 3.1 shows a set of pins, any number of pins, any configuration of pins, and any placement of pins may be used to secure the frame (345) to the printed circuit board (340) without departing from the invention. Further, other mechanical mechanisms, e.g., screws, for affixing the heater apparatus to the frame may be used without departing from the invention.

In one or more embodiments of the invention, the heater component (e.g., 305A) may be made of polyimide film, silicon rubber, any other material, and/or any combination thereof that enables the heater component to perform the functions described herein. In one or more embodiments of the invention, the heater component (e.g., 305A) is disposed between the number of insulator components (e.g., 310A, 310B). Further, the heater apparatus (e.g., 300A) may have sufficient thickness and compliance such that it fits within the narrow gaps above and below the PCI card (e.g., 320A).

In one or more embodiments of the invention, the insulator component, e.g., 310A, 310B, provides electrical insulation characteristics such that it prevents shorting due to any sharp, protruding features on the PCI card. In one or more embodiments of the invention, the insulator component may be made of rigid, flame retardant, and electrically insulating polypropylene material, any type of electrical insulation material, and/or any combination thereof that enables the insulator component to perform the functions described herein.

Turning now to FIG. 3.2, FIG. 3.2 shows a side-view of a portion of a computing device in accordance with one or more embodiments of the invention. In one or more embodiments of the invention, the side-view of the portion of the computing device includes a heater apparatus (not shown) in which the heater apparatus includes a heater component (e.g., 305A) and a number of insulator components (e.g., 310A, 310B), a PCI card (e.g., 320A), a PCI card connector (e.g., 325A), a heat sink (e.g., 330A), a printed circuit board (340), a frame (345), a number of pins (e.g., 350A), a number of holes (e.g., 360A), a PCI card riser (365), and a PCI card cage (370).

In one or more embodiments of the invention, the PCI card (e.g., 320A) is oriented parallel to the printed circuit board (340) and is connected to the PCI card riser (365) via the PCI card connector (e.g., 325A). The heater apparatus is affixed to the frame (345) and the corresponding parts of the frame are affixed to the PCI card riser (365) via the number of pins (e.g., 350A). After applying an inward force (shown with an arrow), the number of pins passes through the number of holes (e.g., 350A) to secure the frame (345) to the PCI card riser (365). While FIG. 3.2 shows a set of pins, any number of pins, any configuration of pins, and any placement of pins maybe used to secure the frame (345) to the PCI card riser (365) without departing from the invention. Further, other mechanical mechanisms, e.g., screws, for affixing the frame to the PCI card riser may be used without departing from the invention.

In an embodiment of the invention shown in FIG. 3.2, the PCI card cage (370) provides additional structural retention and/or protection to the PCI card riser (365) and the hardware components that are affixed to it (e.g., the PCI card (e.g., 320A), the heater apparatus, the heat sink (e.g., 330A), etc.). The PCI card cage (370) may be made of metallic film, any other rigid material, and/or any combination thereof that enables the PCI card cage to perform the functions described herein. In one or more embodiments of the invention, the PCI card riser (365) and the hardware components that are affixed to it can also be protected by the topside of the computing device (e.g., 200, FIG. 2) without departing from the invention.

Turning now to FIG. 3.3, FIG. 3.3 shows a side-view of a portion of a computing device in accordance with one or more embodiments of the invention. In one or more embodiments of the invention, the side-view of the portion of the computing device includes a heater apparatus (not shown) in which the heater apparatus includes a heater component (e.g., 305A) and a number of insulator components (e.g., 310A, 310B), a PCI card (e.g., 320A), a PCI card connector (e.g., 325A), a heat sink (e.g., 330A), a printed circuit board (340), a frame (345), a number of pins (e.g., 350A), a number of holes (e.g., 360A), a PCI card riser (365), a PCI card cage (370), a heater component connector (375), a heater control component (380), a plurality temperature sensors (e.g., 385A), and a plurality of heater component wires (e.g., 390A).

In one or more embodiments of the invention, the heater control component (380) is configured to control the heater component (e.g., 305A) and it may provide heating control services. The heating control services may include (i) obtaining information regarding the temperature of one or more hardware components within the computing device (e.g., 200, FIG. 2), where the information may be obtained through the plurality of temperature sensors (e.g., 385A) in the computing device, (ii) determining a heating condition, e.g., determining whether the temperature within the computing device is below the appropriate operating temperature range (e.g., whether the temperature is below 0° C.), (iii) initiating a heating process to bring the PCI card(s) to their designed operating temperature, and (iv) preventing damage (e.g., thermal runaway) to the heater component (e.g., 305A) in the event of overheating.

While described as a physical structure, the heater control component (380) may be implemented as a logical entity (e.g., a program executing using a number of printed circuit board components (not shown)). For example, the computing device (e.g., 200, FIG. 2) may host a program that provides the functionality of the heater control component.

Continuing the discussion of FIG. 3.3, in an embodiment of the invention shown in FIG. 3.3, one end of the plurality of temperature sensors (e.g., 385A) is operatively connected to the heater control component (380), while the other end of the plurality of temperature sensors is operatively connected to at least one hardware component (e.g., the PCI card (e.g., 320A), the PCI card riser (365), etc.) within the computing device (e.g., 200, FIG. 2).

In one or more embodiments of the invention, the heater control component (380) is configured to determine whether to activate the heater component (e.g., 305A). The heater control component (380) uses input from the plurality of temperature sensors (e.g., 385A) to determine whether to activate the heater component (e.g., 305A). When the heater component (e.g., 305A) needs to be activated, the heater component connector (375) provides power to the heater component (e.g., 305A).

Those skilled in the art will appreciate that while the heater component connector (375) and the heater control component (380) are shown that they are located on top of the printed circuit board (340), they may be placed at any location within the computing device without departing from the invention.

In one or more embodiments of the invention, one end of the plurality of heater component wires (e.g., 390A) is operatively connected to the heater component connector (375), while the other end of the plurality of heater component wires (e.g., 390A) is operatively connected to the heater component (e.g., 305A).

While FIG. 3.3 shows a power connector mechanism, any configuration of power connector mechanism at any location within the computing device may be used to provide the required power to the heater component to initiate the heating process without departing from the invention. Those skilled in the art will appreciate that the heater component (e.g., 305A) may be supplied with power, directly or indirectly (e.g., via the heater component connector, the printed circuit board, etc.), via one or more power supplies (not shown) within the computing device.

The problems discussed above should be understood as being examples of problems solved by embodiments of the invention disclosed herein and the invention should not be limited to solving the same/similar problems. The disclosed invention is broadly applicable to address a range of problems beyond those discussed herein.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A computing device, comprising:
a peripheral component interconnect (PCI) card; and
a heater apparatus located proximate to the PCI card and configured to heat the PCI card.

2. The computing device of claim 1, wherein the heater apparatus comprises a heater component that is parallel to the PCI card.

3. The computing device of claim 2, wherein the heater apparatus comprises a second heater component that is parallel to the PCI card, wherein the heater component is proximate to a first side of the PCI card and the second heater component is proximate to a second side of the PCI card.

4. The computing device of claim 2, wherein the heater component is a polyimide film heater.

5. The computing device of claim 1, further comprising:
   a printed circuit board, wherein the PCI card is connected to the printed circuit board; and
   a frame affixed to the printed circuit board, wherein the heater apparatus is affixed to the frame.

6. The computing device of claim 5, wherein the printed circuit board comprises a heater control component and a heater component connector, wherein the heater control component is configured to determine whether to activate the heater component, wherein the heater component connector is configured to provide power to the heater component when the heater control component determines to activate the heater component.

7. The computing device of claim 6, further comprising:
   a plurality of temperature sensors, wherein a first end of the plurality of temperature sensors is affixed to the heater control component and a second end of the plurality of temperature sensors is affixed to at least one hardware component in the computing device, wherein the heater control component uses input from the plurality of temperature sensors to determine whether to activate the heater component.

8. The computing device of claim 6, wherein a first end of a plurality of heater component wires is affixed to the heater component connector and a second end of the plurality of heater component wires is operatively connected to the heater component.

9. The computing device of claim 1, wherein the heater apparatus comprises a first insulator component, a second insulator component, and a heater component, wherein the heater component is disposed between the first insulator component and the second insulator component.

10. The computing device of claim 1, further comprising:
    a PCI card riser, wherein the PCI card is connected to the PCI card riser,
    a frame, wherein the frame is affixed to the PCI card riser, wherein the heater apparatus is affixed to the frame.

11. An information handling system, comprising:
    a cabinet housing a plurality of computing devices;
    the plurality of computing devices, wherein each of the computing devices comprises:
       a peripheral component interconnect (PCI) card; and
       a heater apparatus located proximate to the PCI card and configured to heat the PCI card.

12. The information handling system of claim 11, wherein the heater apparatus comprises a heater component that is parallel to the PCI card.

13. The information handling system of claim 12, wherein the heater apparatus comprises a second heater component that is parallel to the PCI card, wherein the heater component is proximate to a first side of the PCI card and the second heater component is proximate to a second side of the PCI card.

14. The information handling system of claim 12, wherein the heater component is a polyimide film heater.

15. The information handling system of claim 11, wherein each of the computing devices further comprises:
    a printed circuit board, wherein the PCI card is connected to the printed circuit board; and
    a frame affixed to the printed circuit board, wherein the heater apparatus is affixed to the frame.

16. The information handling system of claim 15, wherein the printed circuit board comprises a heater control component and a heater component connector, wherein the heater control component is configured to determine whether to activate the heater component, wherein the heater component connector is configured to provide power to the heater component when the heater control component determines to activate the heater component.

17. The information handling system of claim 16, wherein each of the computing devices further comprises:
    a plurality of temperature sensors, wherein a first end of the plurality of temperature sensors is affixed to the heater control component and a second end of the plurality of temperature sensors is affixed to at least one hardware component in the computing device, wherein the heater control component uses input from the plurality of temperature sensors to determine whether to activate the heater apparatus.

18. The information handling system of claim 16, wherein a first end of a plurality of heater component wires is affixed to the heater component connector and a second end of the plurality of heater component wires is operatively connected to the heater component.

19. A method for heating a peripheral component interconnect (PCI) card in a computing device, comprising:
    determining a heating condition of the computing device; and
    in response to determination, initiating heating of the PCI card in the computing device using a heater component that is parallel to the PCI card, wherein the heater component is proximate to a first side of the PCI card.

20. The method of claim 19, further comprising:
    in response to the determination:
       initiating heating of a second heater component that is parallel to the PCI card, wherein the second heater component is proximate to a second side of the PCI card.

* * * * *